(12) United States Patent
Shiratori

(10) Patent No.: US 6,496,845 B1
(45) Date of Patent: Dec. 17, 2002

(54) LOW PASS FILTER

(75) Inventor: Akihiro Shiratori, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/440,939

(22) Filed: Nov. 16, 1999

(30) Foreign Application Priority Data

Nov. 18, 1998 (JP) ............................................ 10-327394

(51) Int. Cl.⁷ ............................................... G06F 17/10
(52) U.S. Cl. ..................................... 708/300; 708/319
(58) Field of Search ................................. 708/101, 103, 708/300, 319, 320; 341/52, 53, 152

(56) References Cited

U.S. PATENT DOCUMENTS 5,745,005 A * 4/1998 Natsumi ..................... 329/304
6,167,415 A * 12/2000 Fischer et al. .............. 708/300

FOREIGN PATENT DOCUMENTS

| JP | 62243419 | 10/1987 |
|---|---|---|
| JP | 63-248218 | 10/1988 |
| JP | 2-196505 | 8/1990 |
| JP | 2-284513 | 11/1990 |
| JP | 3-29531 | 2/1991 |
| JP | 4-90614 | 3/1992 |
| JP | 4-330818 | 11/1992 |
| JP | 6-197033 | 7/1994 |
| JP | 8139575 | 5/1996 |
| JP | 8242165 | 9/1996 |
| JP | 2670263 | 7/1997 |
| JP | 9-200009 | 7/1997 |
| JP | 9238056 | 9/1997 |
| JP | 10135795 | 5/1998 |
| JP | 10215167 | 8/1998 |

* cited by examiner

Primary Examiner—Chuong Dinh Ngo
(74) Attorney, Agent, or Firm—Young & Thompson

(57) ABSTRACT

A low pass filter is capable of prevention of increasing of circuit scale there of according to increasing of tap number. The low pass filter initiates counting operation in response to a data input and continuing the counting operation until as an externally designated total tap number is reached, for leading out a counted value as a filter output upon completion of the counting operation.

24 Claims, 9 Drawing Sheets

US 6,496,845 B1

LOW PASS FILTER

BACKGROUND OF THE INVENTION

1. Field of the Invention

The present invention related generally to a low pass filter. More particularly, the invention relates to a low pass filter (hereinafter referred to as "LPF") for infrared ray, in which a filter input is one bit, a tap coefficient of the LPF is one bit and a filter output is one bit.

2. Description of the Related Art

A typical construction of the conventional LPF has been disclosed in Japanese Unexamined Patent Publication No. Heisei 2-284513. The LPF disclosed in the above-identified publication is constructed with a Finite-duration Impulse-Response (FIR) filter 101 and an Infinite-duration Impulse-Response (IIR) filter 102, as shown in FIG. 8.

In the FIR filter 101, among respective outputs of tap delay circuits $T_0$ to $T_{2N+M+1}$, respective outputs of the tap delay circuit $T_0$ to $T_N$ are added by an adder 103 and respective outputs of the tap delay circuits $T_{N+M+1}$ to $T_{2N+M+1}$ are added by an adder 104, respectively. Then, an adder output of the adder 104 is inverted by an inverter 105, and then is added to the adder output of the adder 103 by an adder 106. An adder output of the adder 106 is input to the IIR filter 102 to obtain a final output. It should be noted that D in FIG. 8 is a delay element.

In the meanwhile, since the LPF discussed about is adapted to multiple bit input, a circuit construction corresponding to the tap delay circuits $T_0$ to $T_N$ in FIG. 8 and the adder 103 is required for adapting to one bit input. Therefore, the circuit shown in FIG. 8 is re-writtenas shown in FIG. 9. Namely, the LPF shown in FIG. 9 is the LPF to be used upon demodulation of a signal modulated by a particular frequency, typically an infrared signal. An input X(z) and an output H(z) of the LPF are one bit, respectively, and a multiplying coefficient is "1". The LPF of FIG. 9 is constructed with a data input terminal 1 for inputting an input X(z) of a data string sampled at a sampling frequency f, tap delay circuits $T_1$ to $T_6$ connected to the data input terminal 1 in series for generating a tap delay information of an impulse response, an OR circuit G1 for superimposing tap delay information of the tap delay circuits $T_1$ to $T_6$, and a data output terminal 2 for outputting an output H(z) as a result of superimposing. A filter characteristics of such LPF is determined depending upon number of steps of the tap delay circuits $T_1$ to $T_6$.

Operation of the circuit construction shown in FIG. 9 will be discussed with reference to a timing chart of FIG. 10. For simplification of disclosure, number of stages of the tap delay circuits is set to three stages in FIG. 10. On the other hand, signals of the pulse response 1 to the pulse response 3 are prepared for the purpose of disclosure and represent impulse response as filters for respective pulses of the input X(z).

In FIG. 10, when a pulse P1 as the input X(z) is input in synchronism with a sampling clock, a pulse response 1 corresponding to a period during which the pulse P1 is input and a tap calculation period T for the pulse P1, is obtained. Since no pulse is present before and after the pulse P1, the pulse response 1 corresponding to the pulse P1 is fed in a form of solitary wave as a demodulated output H(z), as is.

Next, the pulse response 1 is similarly obtained for the pulse P2 input as X(z). In the shown case, next pulse P3 is input while responding to the pulse P2. The pulse response for the pulse P3 is executed at a timing of the pulse response 2. On the other hand, a pulse P4 is input while responding to the pulse P3. Similarly, pulse response is executed at a timing of the pulse response 3.

Here, the demodulated output H(z) for the pulse P2 to the pulse P4 is output with obtaining OR of respective pulse responses. At this time, the demodulated output H(z) becomes a signal in which "0" during a period from the pulse P2 to the pulse P3 are smoothed.

In the foregoing conventional LPF, the following drawback is encountered. At first, in the circuit construction shown in FIG. 9, greater number of stages of the tap delay circuits caused greater circuit scale. When the circuit scale is greater, it becomes impossible to equip in a portable equipment.

Next, in the circuit construction shown in FIG. 9, tap delay circuits corresponding to total tap number becomes necessary. As the tap delay circuit, ordinary flip-flop (F/F) is used, and F/Fs in number corresponding to the total tap number are connected in series. In this case, F/Fs in number corresponding to the tap number even when the input X(z) to the filter is not present, is consumed by power by the clock input. When the LPF is packed into LSI, power consumption inherently becomes large,

SUMMARY OF THE INVENTION

The present invention has been worked out for solving the drawbacks in the prior art. It is therefore an object of the present invention to provide an LPF for infrared ray which can realize reduction of circuit scale, lowering of power consumption and improvement of response to switching of number of taps.

According to the first aspect of the present invention, a low pass filter comprises:

counting means for initiating a counting operation in response to a data input and continuing the counting operation until as an externally designated total tap number is reached, for leading out a counted value as a filter output upon completion of the counting operation.

According to the second aspect of the present invention, a low pass filter comprises:

time measuring means for initiating a time measuring operation in response to a data input for leading out a counted value as a filter output upon completion of the time measuring operation.

In the first and second aspect of the present invention it is preferred that the counting means or the time measuring means comprises:

a first m-bit selection circuit, wherein m is a positive integer;

a second m-bit selection circuit taking an output of the first m-bit selection circuit and a first fixed value for selectively outputting the output of the first m-bit selection circuit and the first fixed value depending upon an input data to own filter;

a m-bit flip-flop taking an output of the second m-bit selection circuit as an input data;

a first comparator circuit comparing an output data of the m-bit flip-flop and a second fixed value;

a m-bit adder circuit for adding an output of the first comparator circuit to the least significant bit of the output data of the m-bit flip-flop; and a second comparator circuit for comparing the output data of the m-bit flip-flop and an externally input total tap number value, the first m-bit selection circuit taking an output of the m-bit adder and a third fixed value as inputs for selectively outputting one of the output of the m-bit adder and the third fixed value depending upon an output of the second m-bit comparator circuit for leading the output of the first m-bit comparator circuit as a filter output.

According to the third aspect of the present invention, a low pass filter comprises:

counting means for initiating a counting operation in response to a data input; and comparing means for comparing a counted value counted by the counting means and an externally designated total tap number for leading out the counted value as a filter output when a result of comparison taken place by the comparing means shows matching of the counted value and the externally designated total tap number.

According to the fourth aspect of the present invention. a low pass filter comprising:

time measuring means for initiating a time measuring operation in response to a data input; and comparing means for comparing a measured time measured by the time measuring means and an externally designated total tap number for leading out the counted value as a filter output when a result of comparison taken place by the comparing means shows matching of the measured time and the externally designated total tap number.

In the foregoing third and fourth aspect of the present invention, it is preferred that the counting means or the time measuring means comprises:

a first m-bit selection circuit, wherein m is a positive integer;

a second m-bit selection circuit taking an output of the first m-bit selection circuit and a first fixed value for selectively outputting the output of the first m-bit selection circuit and the first fixed value depending upon an input data to own filter;

a m-bit flip-flop taking an output of the second m-bit selection circuit as an input data;

a comparator circuit comparing an output data of the m-bit flip-flop and a second fixed value; and a m-bit adder circuit for adding an output of the first comparator circuit to the least significant bit of the output data of the m-bit flip-flop;

the first m-bit selection circuit taking an output of the m-bit adder and a third fixed value as inputs for selectively outputting one of the output of the m-bit adder and the third fixed value depending upon an output of the comparator circuit, the comparator circuit comparing the output data of the m-bit flip-flop and an externally input total tap number for leading the output of the comparator circuit as a filter output.

In short, the low pass filter according to the present invention has the tap position counting means for counting the tap position of impulse response generated by the most recent input from the data input terminal. By comparison of the result of counting and the total tap number of the filter, judgment is made whether impulse response to the most recent data input is completed or not. As the output of the low pass filter, "H" level is required within the impulse response period and "L" level is required otherwise. The output of the comparator circuit employed in the present invention, a value equivalent to the low pass filter can be obtained. Also, the tap position counting portion according to the present invention is constructed with the flip-flop in equal number as the input signal setting the total tap number. Therefore, power consumption during stand-by state and in operation can be minimized.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

Figure 1:
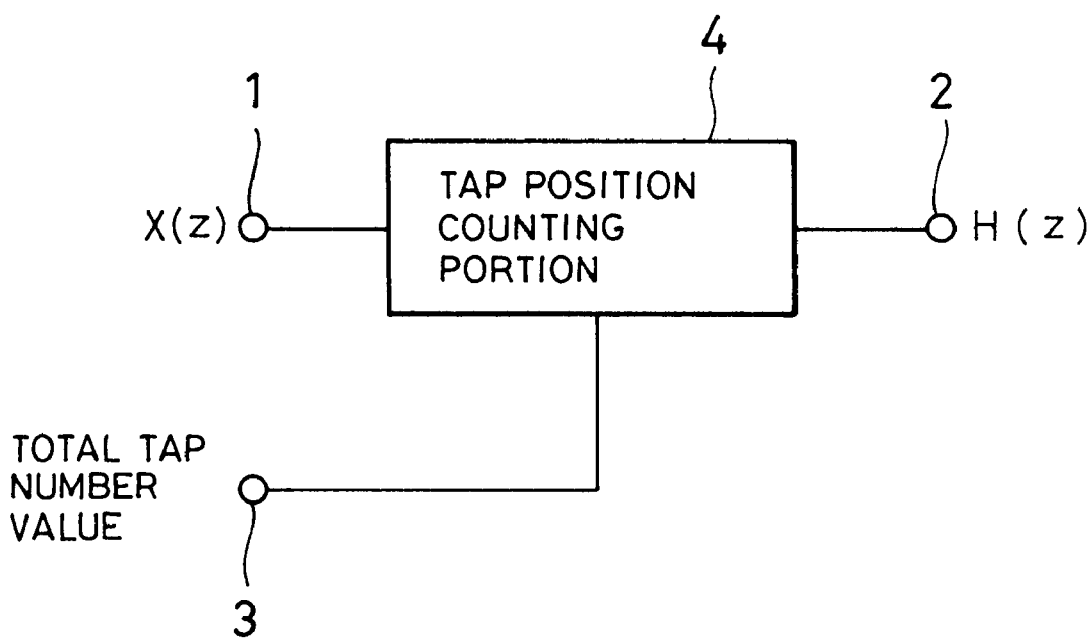
FIG. 1 is a circuit diagram showing one mode of implementation of an LPF for infrared ray in accordance with the present invention.

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention. Like components are identified by like reference numerals throughout the disclosure and drawings.

FIG. 1 is a block diagram of one mode of implementation of an LPF according to the present invention. In FIG. 1, the shown LPF is constructed with a data input terminal 1, a fixed value input terminal 3, a tap position counting portion 4 for counting tap position of an impulse response generated by the most recent data input through the data input terminal 1 (performing counting of a period corresponding to the impulse response period), and a data output terminal 2 for taking out a result of counting as a filter output.

The most recent data input through the data input terminal 1 is input to the tap position counting portion 4. From the fixed value input terminal 3, a total tap number as the LPF is applied. In the tap position counting portion 4, the tap position for data input from the data input terminal 1 is calculated and output. Demodulated output H(z) counting of which is continued until the calculated tap position and the value input from the fixed value input terminal 3 matches with each other, becomes "H level" during the impulse response period and "L level" out of the impulse response period. From the output of the comparator circuit CMP, a value equivalent to the result of process in the LPF can be obtained.

Figure 2:
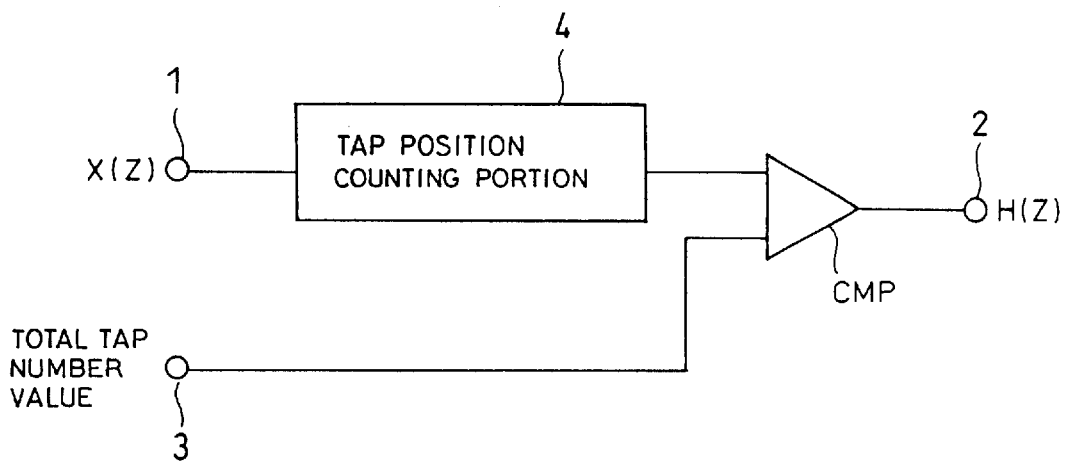
FIG. 2 is a circuit diagram showing another mode of implementation of an LPF for infrared ray in accordance with the present invention.

FIG. 2 is a block diagram of another mode of implementation of the LPF according to the present invention. In FIG. 2, the shown LPF is constructed with the data input terminal 1, the fixed value input terminal 3, the tap position counting portion 4 for counting tap position of an impulse response generated by the most recent data input through the data input terminal 1, the comparator circuit CMP comparing the result of counting by the tap position counting portion 4 and the input from the fixed value input terminal 3, and a data output terminal 2 for taking out a result of comparison by the comparator circuit CMP as the filter output.

The most recent data input from the data input terminal 1 is input to the tap position counting portion 4. From the fixed value input terminal 3, the total tap number as the LPF is applied. In the tap position counting portion 4, the tap position for the data input from the data input terminal 1 is calculated and output. By comparing the calculated tap position and the value input from the fixed value input terminal 3, judgment can be made whether the impulse response for the most recent data input is completed or not. The demodulated output H(z) becomes "H level" in the impulse response period and "L level" out of the impulse response period to obtain the value equivalent to the result of process in the LPF from the output of the comparator circuit CMP.

Figure 3:
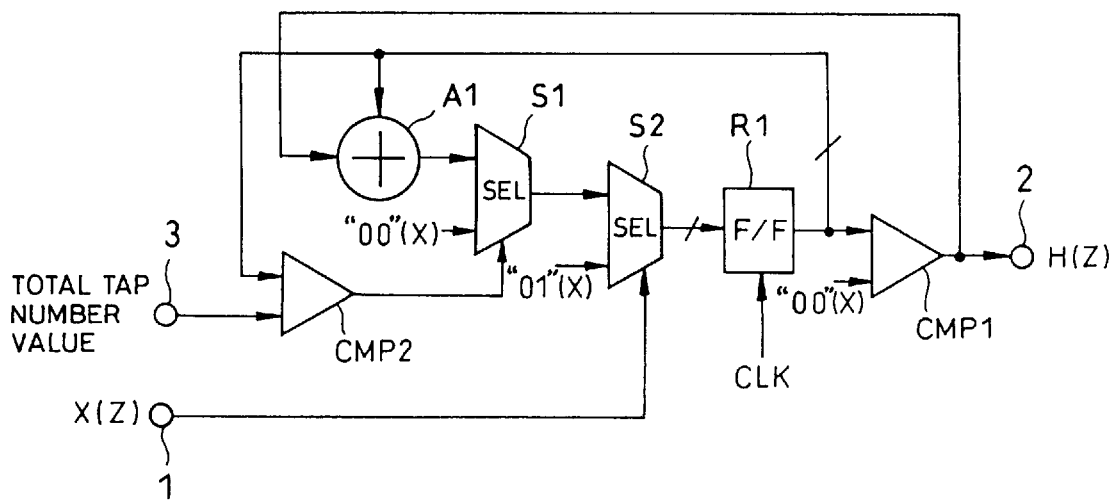
FIG. 3 is a circuit diagram showing the first embodiment of the LPF for infrared ray according to the present invention.

FIG. 3 is a circuit diagram showing the construction of the first embodiment of the LPF according to the present invention. In FIG. 3, the shown embodiment of the low pass filter is constructed with the data input terminal 1, the total filter tap number input terminal 3, a second m-bit selection circuit S2 controlled by an input data to own filter input to the data input terminal 1 with taking an output of a first m-bit selection circuit S1 and a first fixed value as inputs, and a m-bit flip-flop R1 operated in synchronism with a clock CLK with taking the output of the second m-bit selection circuit S2 as data input.

On the other hand, the low pass filter of the shown embodiment is constructed with a first comparator circuit CMP1 comparing the data output of the m-bit flip-flop R1 and a second fixed value, an m-bit adder circuit A1 adding the output of the first comparator circuit CMP1 to the least significant bit of the data output of them-bit flip-flop R1, a second comparator circuit CMP2 comparing a data output of the m-bit flip-flop R1 and an input from the total filter tap number input terminal 3, a first m-bit selection circuit S1 controlled by an output of the second comparator circuit CMP2 with taking an output of the m-bit adder circuit A1 and a third fixed value as inputs, and a data output terminal 2 connected to the output of the first comparator circuit CMP1. It should be noted that, the least significant bit of the first fixed value is assumed to be set at "1", all bits of the first fixed value other than the least significant bit are assumed to be set at "0", and respective constants m are set at a value derived by rounding a logarithm of 2 of the total filter tap number into the integer. In FIG. 3, (x) represents that the value is a decimal value.

Here, the total filter tap number input to the input terminal 3 is preliminarily designated externally. However, the tap number is not fixed value and can be varied by the value designated externally. As discussed later, the value may be varied sequentially. The total filter tap number is a value corresponding to the impulse response period of the input data. On the other hand, the total tap number is determined depending number of stages of delay element groups of the low pass filter having a plurality of stages of delay elements connected in cascade connection in order to lead out the tap.

In FIG. 3, in a condition where the input from the data input terminal 1 is "H" level, "1" is output from the least significant bit of the second m-bit selection circuit S2, and "0" are output from all bits other than the least significant bit. This value is input to the first comparator circuit CMP1 via the m-bit flip-flop R1. In the first comparator circuit CMP1, "L" is output when the comparing value and the compared value are equal to each other. Another inputs of the first comparator circuit CMP1 are "0" and the least significant bit thereof is not "1". Therefore, "H" is output from the first comparator circuit CMP1.

The result of comparison is output to the output terminal 2, and in conjunction therewith, is added to the least significant bit of the adder circuit A1. Therefore, the adder circuit A1 increments a value derived the current value of the m-bit flip-flop R1 by "+1". Thus, in the adder circuit A1, the current tap position with respect to the most recent data input is counted. In the second comparator circuit CMP2, the current value of the m-bit flip-flop R1 and the set value set by the total tap number input terminal 3 are compared. When the current value of the m-bit flip-flop R1 becomes equal to the total tap number, the output of the first m-bit selection circuit S1 are set "0" and when the current value of the m-bit flip-flop R1 is less than the total tap number, control for selecting the output of the adder circuit A1 is performed. When "0" are output at all bits of the output of the first m-bit selection circuit S1, it represents that the current tap position exceeds the total tap number. Therefore, in order to terminate impulse response, all bits of the input of the first comparator circuit CMP1 are set to "0" via the second m-bit selection circuit and the m-bit flip-flop R1. By this, the first comparator circuit CMP1 outputs "L" to set the output terminal 2 "L", and in conjunction therewith, to terminal incrementing by "+1" in the adder circuit A1. By this, all bits of the value of the m-bit flip-flop are held at "0".

Here, assuming that an LPF transfer function is expressed by the following formula (1), when respective of the input, output and the tap coefficients are one bit, it can take only K(i)=1. Therefore, the formula (1) can be modified as the following formula (2).

$$H(z) = \Sigma(X(i) * K(i)) \qquad (1)$$

$$H(z) = \Sigma(X(i)) \qquad (2)$$

It should be noted that, in the foregoing formula (1) and (2), i=0, 1, . . . , n. All of the X(i) are the same value and are one bit. Therefore, it becomes equivalent to output "1" for n times when "1" is input to the input X(0). Namely, by employing a circuit outputting n in number of "1" corresponding to the total tap number when "1" is input to the input X(0), the low pass filter can be realized.

In FIG. 3, the counter is constructed with the second m-bit selection circuit S2, the m-bit flip-flop R1, the m-bit adder A1 and the first m-bit selection circuit S1. When "1" is input to the input X(z), counting is executed during a period (namely a period of impulse response) up to reaching the total tap number to terminal counting at a timing when the counted value reaching the total tap number is detected by the comparator CMP2. In the comparator circuit CMP1, the period to which the input X(z) is input and the period where count is executed are executed to take as the output of the shown filter.

Figure 4:
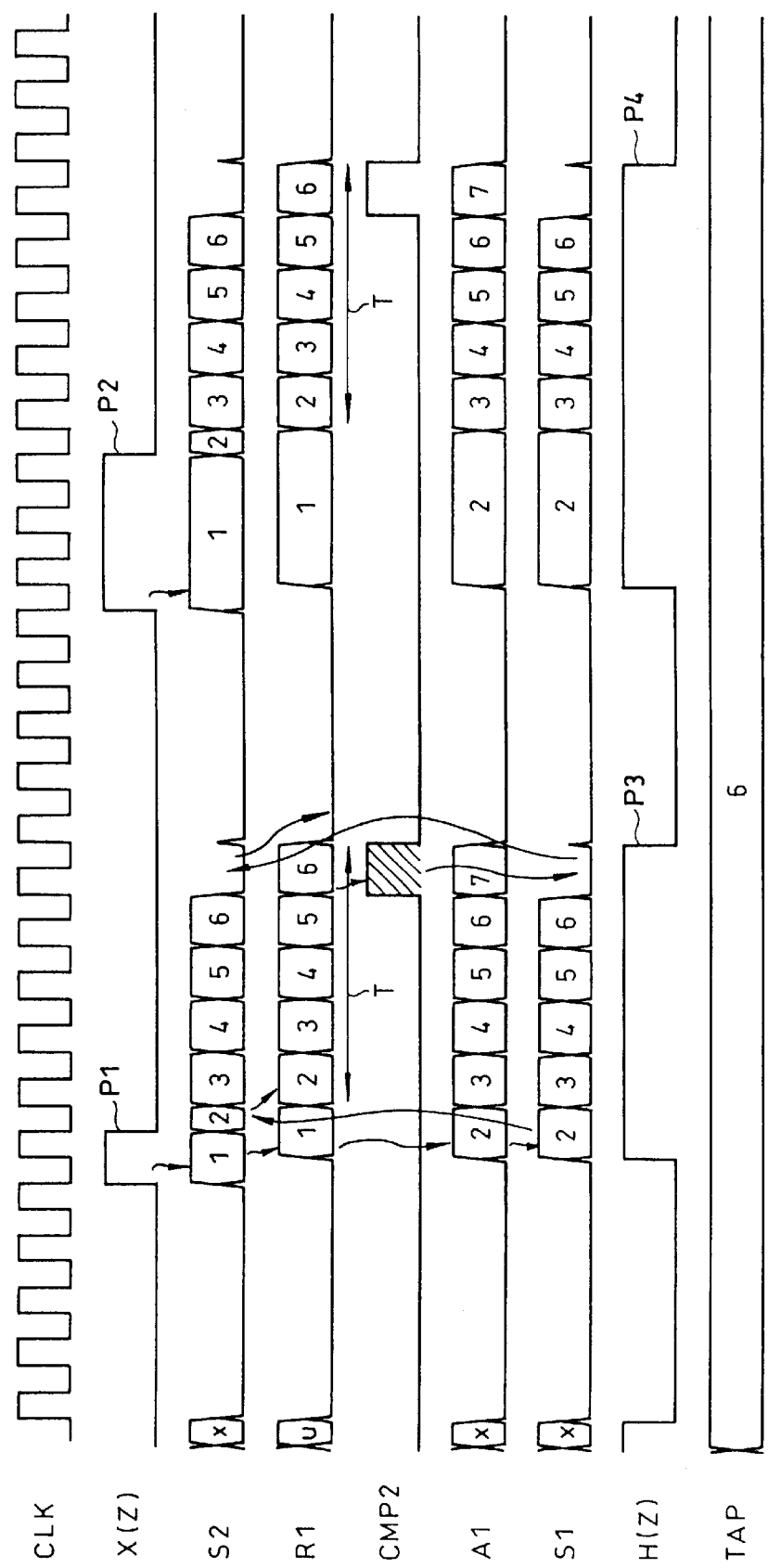
FIG. 4 is a timing chart showing operational example of the LPF for infrared ray of FIG. 3.

FIG. 4 is a timing chart showing one example of a result of simulation upon setting the value at "6" assuming that the total filter tap number input terminal 3 in the circuit construction of FIG. 3 is four bits. In FIG. 4, signals equivalent to respective signals in FIG. 3 will be represented by the same reference numerals.

In FIG. 4, "CLK" denotes an input clock, "X(z)" denotes an input X(z) from the data input terminal 1, "H(z)" denotes the output H(z) from the data output terminal 2, "R1" denotes a state value of the m-bit flip-flop, "TAP" is a total tap number set at the total filter tap number input terminal 3, "S1" and "S2" are outputs of respective of first and second m-bit selection circuits S1 and S2, and "A1" denotes an output of the adder.

In FIG. 4, with respect to the pulse P1 appearing on the input X(z), the pulse P3 appears on the filter output H(z). In this case, a period while the output of the selection circuit S2 is varied from "2" to "6" is the tap calculation period. When the output of the selection circuit S2 becomes "6" corresponding to the total tap number, the result of comparison in the comparator CMP2 shows matching (illustrated by the hatched portion). Then, the output of the selection circuit S1 becomes "00".

Similarly, with respect to the pulse P2 appearing at the input X(z), a pulse P4 appears at the filter output H(z). In this case, the period while the output of the selection circuit S2 is varied from "2" to "6" is the tap calculation period T. When the output of the selection circuit S2 becomes "6" corresponding to the total tap number, the result of comparison in the comparator CMP2 shows matching (illustrated by the hatched portion). Then, the output of the selection circuit S1 becomes "00".

Figure 5:
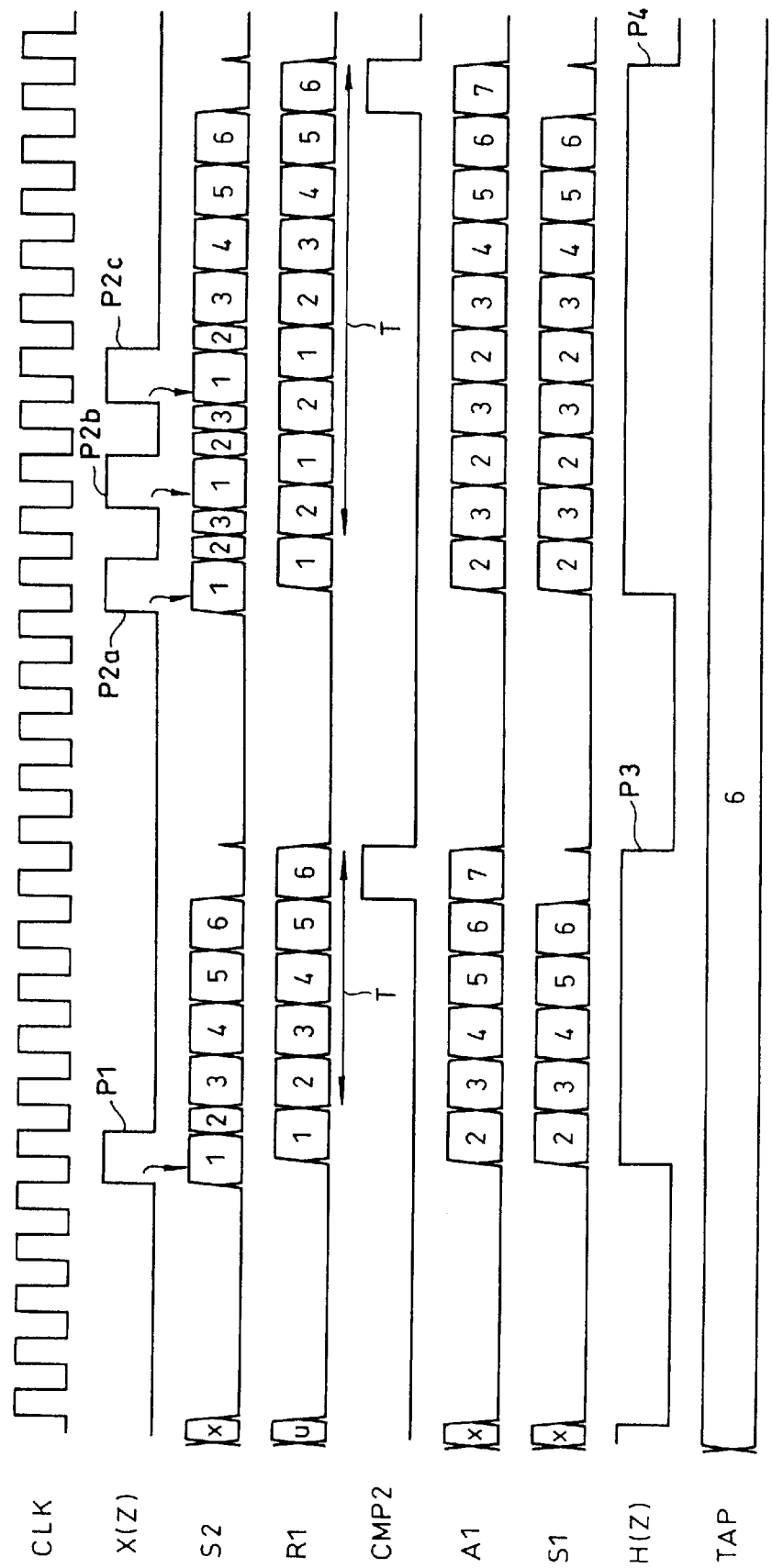
FIG. 5 is a timing chart showing another operational example of the LPF for infrared ray of FIG. 3.

FIG. 5 is a timing chart showing another example of the result of simulation, wherein respective signals equivalent to the signals in FIG. 3 will be represented by the same reference numerals.

In FIG. 5, with respect to the pulse P1 appearing at the input X(z), a pulse P3 appears at the filter output H(z). Then, if the output of the selection circuit S2 becomes "6" corresponding to the total tap number, the result of comparison in the comparator CMP2 shows matching, and the output of the selection circuit S1 becomes "00".

On the other hand, with respect to the pulse P2a, P2b, P2c appearing at the input X(z), a pulse P4 appears at the filter output H(z). In this case, at every occasion of input of respective pulses P2a, P2b, P2c, the output of the selection circuit S2 becomes "1". At this time, the period while the output of the selection circuit S2 is varied from "2" to "6" initially, is the tap calculation period T. When the output of the selection circuit S2 becomes "6" corresponding to the total tap number, the result of comparison in the comparator CMP2 shows matching. Then, the output of the selection circuit S1 becomes "00".

As set forth above, instead of the construction employing a multiplier, a construction employing the counter performing counting depending upon number of stages of connection of the delay element groups of the low pass filter having a plurality of stages of the delay element groups connected in cascades connection for leading out the tap of the filter, the LPF suppressing the size of the circuit as small as possible can be realized.

Figure 6:
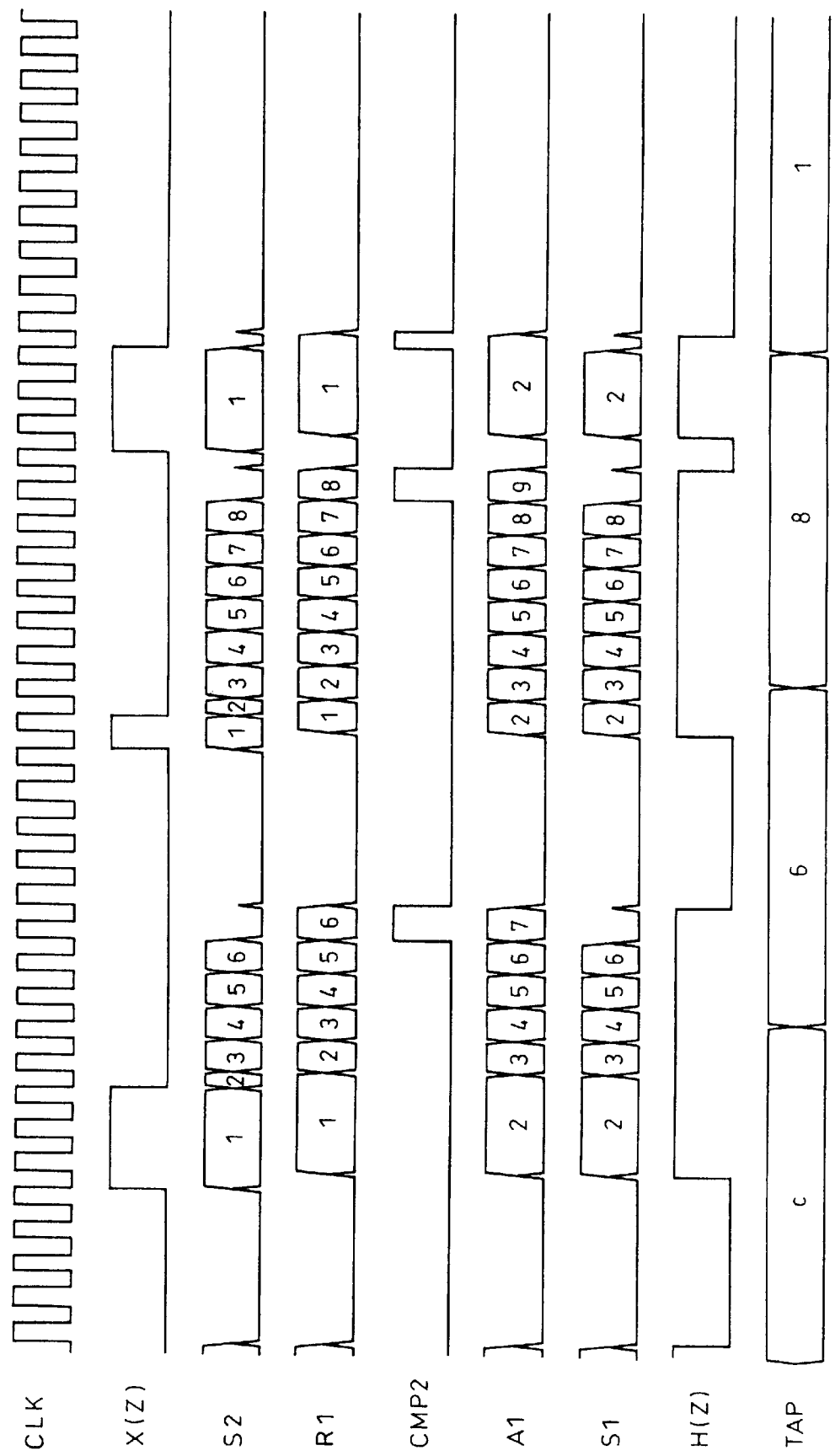
FIG. 6 is a timing chart showing a further operational example of the LPF for infrared ray of FIG. 3.

FIG. 6 is a timing chart showing a further example of the result of simulation upon setting the value varied sequentially, with taking the total filter tap number input terminal 3 as 4 bits in the circuit construction shown in FIG. 3. It should be noted that, in FIG. 4, total tap number set at the total filter tap number input terminal 3 is varied sequentially from "C"(h) to "6"(h), "8"(h), "1"(h) ("(h)" represents that the values are hexadecimal number).

At this time. according to variation of the total tap number, the counted value in the state value R1 if the m-bit flip-flop R1 is obtained up to "6"(h), "8"(h), "1"(h), respectively.

Figure 7:
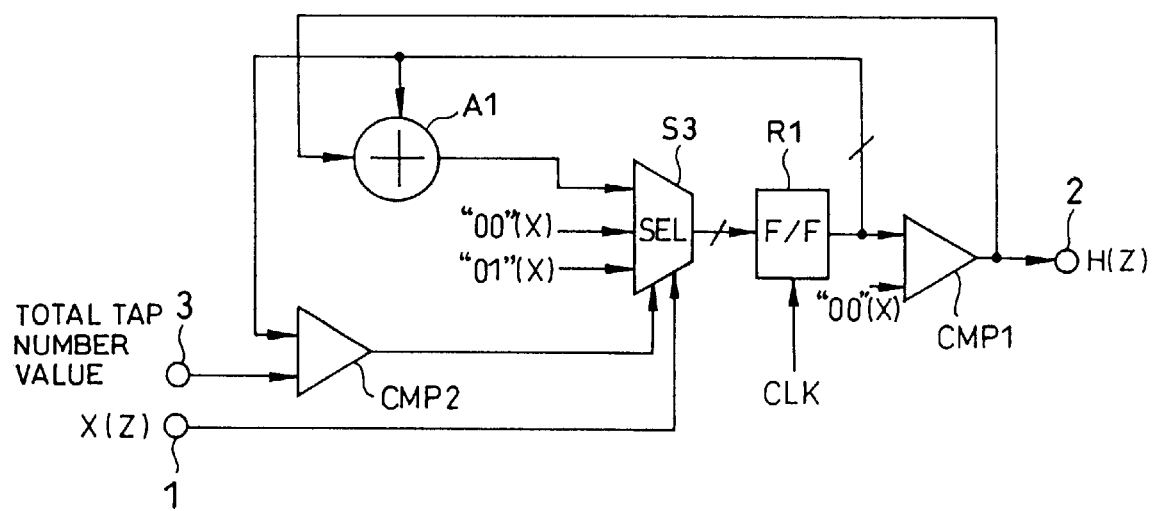
FIG. 7 is a circuit diagram showing the second embodiment of the LPF for infrared ray according to the present invention.
Figure 8:
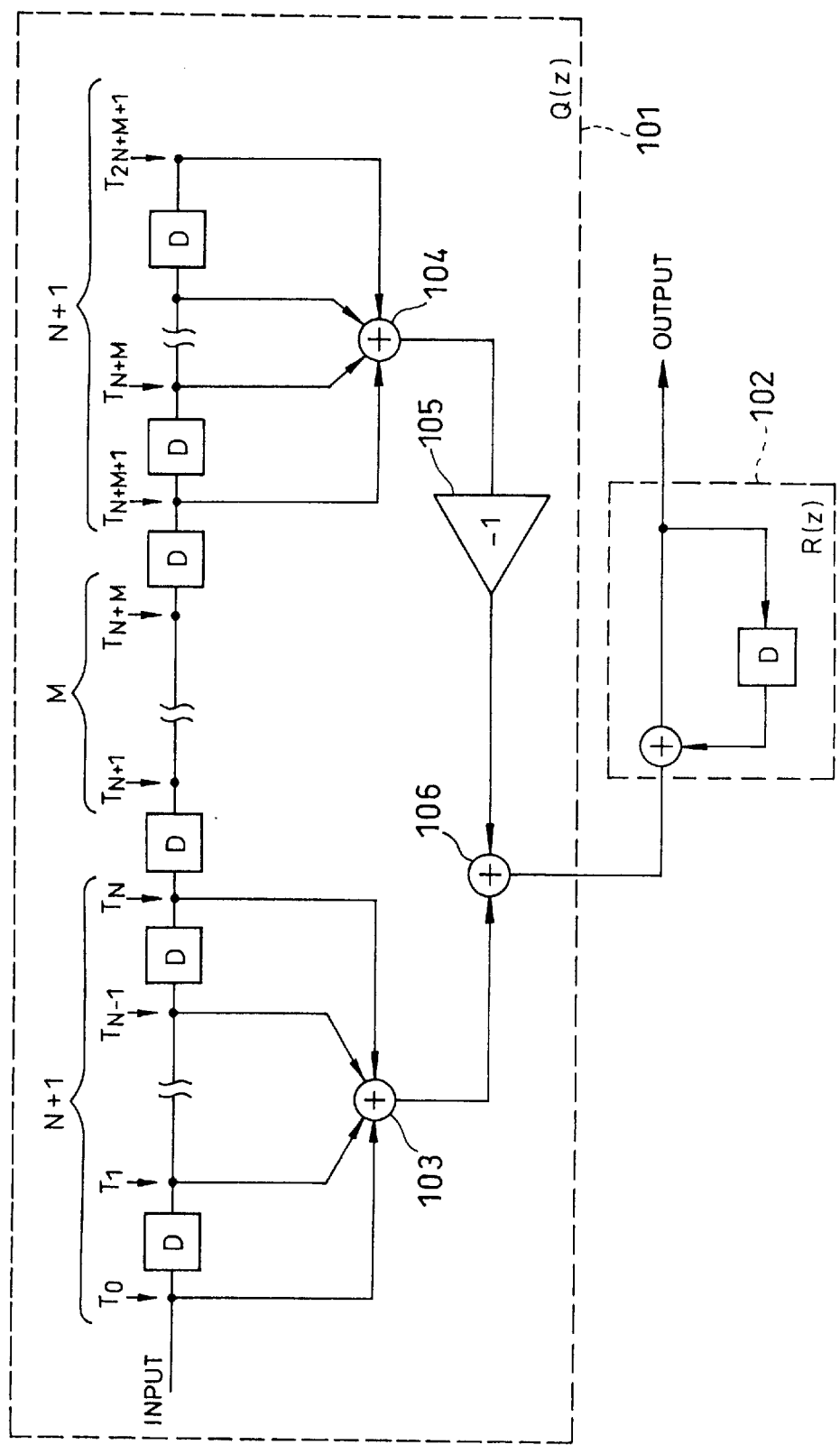
FIG. 8 is a circuit diagram showing a construction of a low pass filter disclosed in Japanese Unexamined Patent Publication No. Heisei 2-284513.
Figure 9:
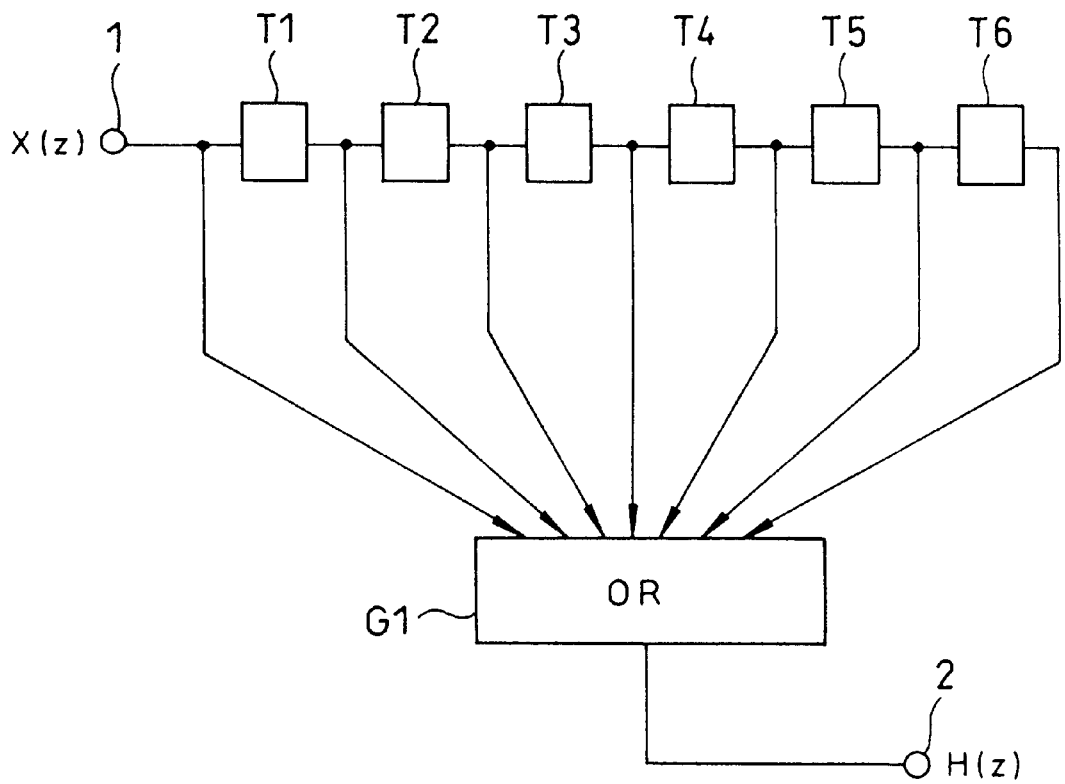
FIG. 9 is a circuit diagram showing a construction of the low pass filter constructed by extracting a part of the low pass filter of FIG. 8.
Figure 10:
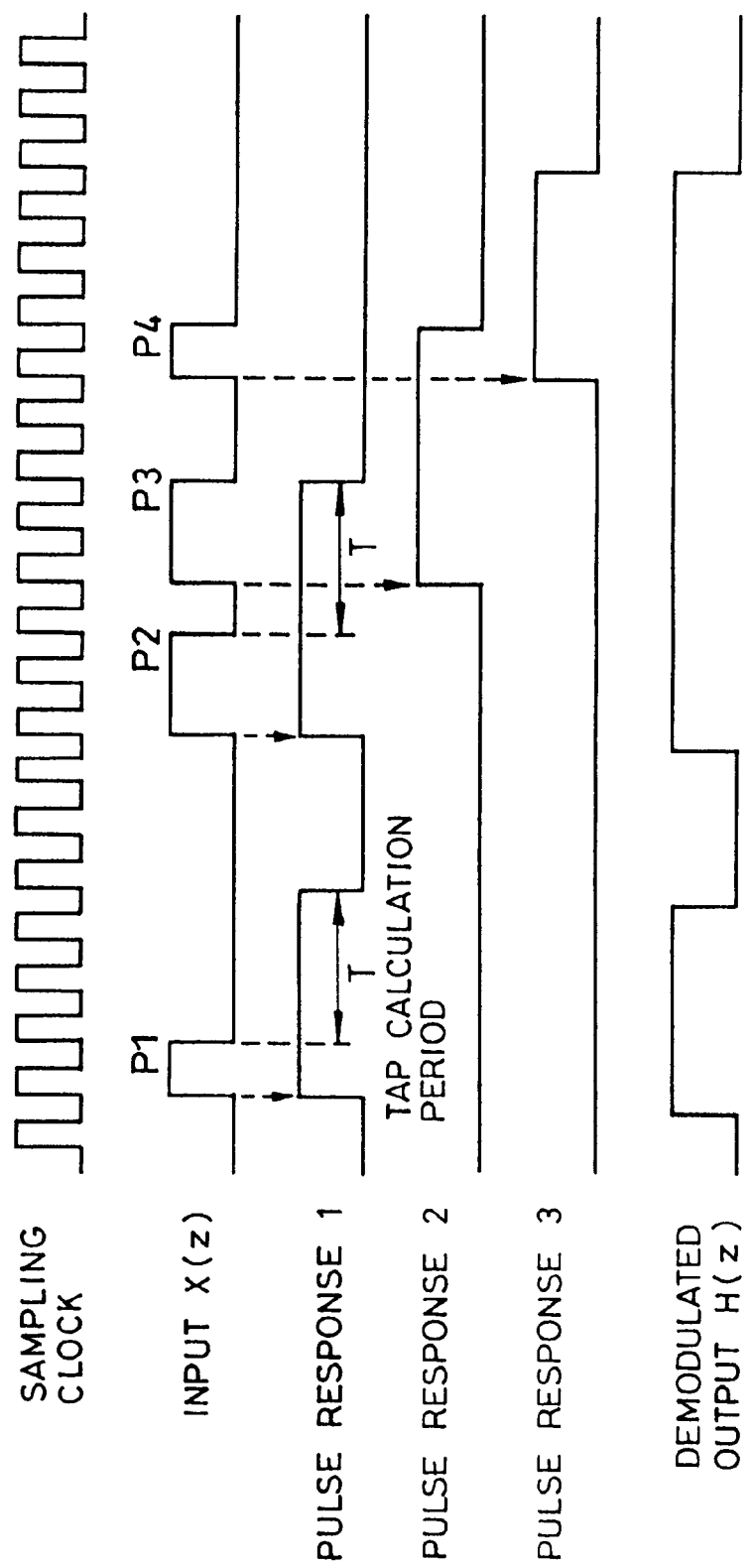
FIG. 10 is a timing chart showing operational example of LPF of FIG. 9.

FIG. 7 is a circuit diagram showing a construction of the second embodiment of the LPF of the present invention. In FIG. 7, the low pass filter in the shown embodiment is constructed with the data input terminal 1, the total filter tap number input terminal 3, the third m-bit selection circuit S3 controlled by the outputs of the data input terminal 1 and the second comparator circuit CMP2 with taking the output of the m-bit adder circuit A1 and the first and second fixed values, and the m-bit flip-flop R1 taking the output of the third m-bit selection circuit S3 as data input. It should be noted that, to the m-bit flip flop R1, the clock CLK is input.

On the other hand, the low pass filter according to the shown embodiment is constructed with a first comparator circuit CMP1 comparing the data output of the m-bit flip-flop R1 and the third fixed value, an m-bit adder circuit A1 adding the output of the first comparator circuit CMP1 to the least significant bit of the data output of the m-bit flip-flop R1, a second comparator circuit CMP2 comparing a data output of the m-bit flip-flop R1 and an input from the total filter tap number input terminal 3, and a data output terminal 2 connected to the output of the first comparator circuit CMP1. It should be noted that the least significant bit of the first fixed value is assumed to be set at "1", all bits of the first fixed value other than the least significant bit are assumed to be set at "0", all bits of the second and the third fixed value are assumed to be set at "0", and respective constants m are set at a value derived by rounding a logarithm of 2 of the total filter tap number into the integer.

In short, the LPF of the shown embodiment is constructed with including a third m-bit selection circuit selectively controlled by the output of the input data to the own filter and the output of the second comparator circuit, in place of the first and second m-bit selection circuits S1 and S2 in the first embodiment of the LPF set forth above. The first and second m-bit selection circuits S1 and S2 are different only in one bit of the input fixed values, and other construction is the same. Therefore, by making the same components in common, the m-bit selection circuit S3 in FIG. 7 can be obtained. Accordingly, the basic operation of the LPF shown in FIG. 7 is the same as that of the LPF illustrated in FIG. 3, but the circuit construction of FIG. 7 can realize the LPF with smaller circuit scale than the circuit construction of the embodiment shown in FIG. 3.

When the tap coefficient is one bit and the total tap number is n, generation of the tap coefficient is performed only in the period where X(z) is "0". On the other hand, H(z) is equal to X(z) during the period where X(z) is "1". From this fact, the tap coefficient corresponding to the impulse response for one time is generated when X(z) becomes "0".

Since the set total tap number and the tap position of the impulse response corresponding to the past input are compared and control to respond or not is performed depending upon the result of comparison, switching of the filter coefficient can follow in real time without depending upon X (z) input in the past.

As set forth above, number of F/Fs to be used in the conventional LPF was equal to the total number of the tap delay circuit. In contrast to this, in the LPF according to the present invention, the total number of F/Fs to be used by applying the total tap number in binary number can be reduced to be INT($\log_2$ (Tap Number) ). It should be noted that "INT" represents rounding of the value within parenthesis ( ) into the integer.

Associating with reduction of total number of the F/F used, a power consumption in stand-by state can be reduced into (INT ($\log_2$ (Tap Number) )/(Tap Number) )relative to the power to be consumed by the F/Fs for the total number of the tap delay circuit. On the other hand, a period required for switching the total tap number is the waiting period corresponding to the total number of the tap delay circuit in the conventional LPF. In contrast to this, in the present invention, the total tap number can be varied in real time to require no waiting period.

Since the shown LPF can make the circuit scale smaller since the multiplier is not employed. Therefore, the LPF according to the present invention is optimal for radio serial communication in a notebook type personal computer, a portable information terminal or household electrical appliances. Also, it is applicable for network in home, i.e. so-called home bus.

As set forth above, the present invention can reduce total number of F/Fs to be used by applying the total tap number in binary value. Also, since the switching timing of the total tap number can be varied in real time, it becomes possible to realize reduction of the circuit scale, reduction of power consumption, improvement of response characteristics for switching of the tap number.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

For instance, the low pass filter according to the present invention is applicable in a demodulation circuit disclosed in the commonly owned co-pending U.S. patent application, now U.S. Pat. No. 6,335,658 entitled "Demodulation Circuit" and filed with claiming priority based on Japanese Patent Application No. Heisei 10-327395 and No. Heisei 10-327396, both filed on Nov. 18, 1998. The disclosure of the above-identified commonly owned co-pending application is herein incorporated by reference.

What is claimed is:

1. A low pass filter comprising:
   counting means for initiating a counting operation in response to a data input and continuing said counting operation until as an externally designated total tap number is reached, for leading out a counted value as a filter output upon completion of said counting operation.

2. A low pass filter as set forth in claim 1, wherein said counting means comprises:
   a first m-bit selection circuit, wherein m is a positive integer;
   a second m-bit selection circuit taking an output of said first m-bit selection circuit and a first fixed value for selectively outputting said output of said first m-bit selection circuit and said first fixed value depending upon an input data to own filter;
   a m-bit flip-flop taking an output of said second m-bit selection circuit as an input data;
   a first comparator circuit comparing an output data of said m-bit flip-flop and a second fixed value;
   a m-bit adder circuit for adding an output of said first comparator circuit to the least significant bit of the output data of said m-bit flip-flop; and
   a second comparator circuit for comparing the output data of said m-bit flip-flop and an externally input total tap number value,
   said first m-bit selection circuit taking an output of said m-bit adder and a third fixed value as inputs for selectively outputting one of said output of said m-bit adder and said third fixed value depending upon an output of said second m-bit comparator circuit for leading the output of said first m-bit comparator circuit as a filter output.

3. A low pass filter as set forth in claim 2, which further comprises a third m-bit selection circuit in place of said first and second m-bit selection circuit, said third m-bit selection circuit being selectively controlled by said input data and the output of said second comparator circuit.

4. A low pass filter as set forth in claim 2, wherein the least significant bit of said first fixed value is set "1" and all bits of said first fixed value other than the least significant bit are set "0", all bits of said second fixed value and said third fixed value are set "0", and said m being set at a value derived by rounding a logarithm of 2 of the total filter tap number value into an integer.

5. A low pass filter as set forth in claim 1, wherein said total tap number value is a value corresponding to an impulse response period of said input data.

6. A low pass filter as set forth in claim 1, wherein said total tap number value is determined depending upon number of stages of delay element groups of the low pass filter having a plurality of delay element groups connected in cascade connection for leading out a tap.

7. A low pass filter comprising:
   counting means for initiating a counting operation in response to a data input; and
   comparing means for comparing a counted value counted by said counting means and an externally designated total tap number for leading out said counted value as a filter output when a result of comparison taken place by said comparing means shows matching of the counted value and said externally designated total tap number.

8. A low pass filter as set forth in claim 7, wherein said counting means comprises:
   a first m-bit selection circuit, wherein m is a positive integer;
   a second m-bit selection circuit taking an output of said first m-bit selection circuit and a first fixed value for selectively outputting said output of said first m-bit selection circuit and said first fixed value depending upon an input data to own filter;
   a m-bit flip-flop taking an output of said second m-bit selection circuit as an input data;
   a comparator circuit comparing an output data of said m-bit flip-flop and a second fixed value; and
   a m-bit adder circuit for adding an output of said first comparator circuit to the least significant bit of the output data of said m-bit flip-flop;
   said first m-bit selection circuit taking an output of said m-bit adder and a third fixed value as inputs for selectively outputting one of said output of said m-bit adder and said third fixed value depending upon an output of said comparator circuit, said comparator circuit comparing the output data of said m-bit flip-flop and an externally input total tap number for leading the output of said comparator circuit as a filter output.

9. A low pass filter as set forth in claim 8, which further comprises a third m-bit selection circuit in place of said first and second m-bit selection circuit, said third m-bit selection circuit being selectively controlled by said input data and the output of said comparator circuit.

10. A low pass filter as set forth in claim 8, wherein the least significant bit of said first fixed value is set "1" and all bits of said first fixed value other than the least significant bit are set "0", all bits of said second fixed value and said third fixed value are set "0", and said m being set at a value derived by rounding a logarithm of 2 of the total filter tap number value into an integer.

11. A low pass filter as set forth in claim 7, wherein said total tap number value is a value corresponding to an impulse response period of said input data.

12. A low pass filter as set forth in claim 7, wherein said total tap number value is determined depending upon number of stages of delay element groups of the low pass filter having a plurality of delay element groups connected in cascade connection for leading out a tap.

13. A low pass filter comprising:
   time measuring means for initiating a time measuring operation in response to a data input for leading out a counted value as a filter output upon completion of said time measuring operation.

14. A low pass filter as set forth in claim 13, wherein said time measuring means comprises:
   a first m-bit selection circuit, wherein m is a positive integer;
   a second m-bit selection circuit taking an output of said first m-bit selection circuit and a first fixed value for selectively outputting said output of said first m-bit selection circuit and said first fixed value depending upon an input data to own filter;
   a m-bit flip-flop taking an output of said second m-bit selection circuit as an input data;
   a first comparator circuit comparing an output data of said m-bit flip-flop and a second fixed value;
   a m-bit adder circuit for adding an output of said first comparator circuit to the least significant bit of the output data of said m-bit flip-flop; and
   a second comparator circuit for comparing the output data of said m-bit flip-flop and an externally input total tap number value,
   said first m-bit selection circuit taking an output of said m-bit adder and a third fixed value as inputs for selectively outputting one of said output of said m-bit adder and said third fixed value depending upon an output of said second m-bit comparator circuit for leading the output of said first m-bit comparator circuit as a filter output.

15. A low pass filter as set forth in claim 14, which further comprises a third m-bit selection circuit in place of said first and second m-bit selection circuit, said third m-bit selection circuit being selectively controlled by said input data and the output of said second comparator circuit.

16. A low pass filter as set forth in claim 14, wherein the least significant bit of said first fixed value is set "1" and all bits of said first fixed value other than the least significant bit are set "0", all bits of said second fixed value and said third fixed value are set "0", and said m being set at a value derived by rounding a logarithm of 2 of the total filter tap number value into an integer.

17. A low pass filter as set forth in claim 13, wherein said total tap number value is a value corresponding to an impulse response period of said input data.

18. A low pass filter as set forth in claim 13, wherein said total tap number value is determined depending upon number of stages of delay element groups of the low pass filter having a plurality of delay element groups connected in cascade connection for leading out a tap.

19. A low pass filter comprising:
   time measuring means for initiating a time measuring operation in response to a data input; and
   comparing means for comparing a measured time measured by said time measuring means and an externally designated total tap number for leading out said counted value as a filter output when a result of comparison taken place by said comparing means shows matching of the measured time and said externally designated total tap number.

20. A low pass filter as set forth in claim 19, wherein said time measuring means comprises:
   a first m-bit selection circuit, wherein m is a positive integer;
   a second m-bit selection circuit taking an output of said first m-bit selection circuit and a first fixed value for selectively outputting said output of said first m-bit selection circuit and said first fixed value depending upon an input data to own filter;
   a m-bit flip-flop taking an output of said second m-bit selection circuit as an input data;
   a comparator circuit comparing an output data of said m-bit flip-flop and a second fixed value; and
   a m-bit adder circuit for adding an output of said first comparator circuit to the least significant bit of the output data of said m-bit flip-flop;
   said first m-bit selection circuit taking an output of said m-bit adder and a third fixed value as inputs for selectively outputting one of said output of said m-bit adder and said third fixed value depending upon an output of said comparator circuit,
   said comparator circuit comparing the output data of said m-bit flip-flop and an externally input total tap number for leading the output of said comparator circuit as a filter output.

21. A low pass filter as set forth in claim 20, which further comprises a third m-bit selection circuit in place of said first and second m-bit selection circuit, said third m-bit selection circuit being selectively controlled by said input data and the output of said comparator circuit.

22. A low pass filter as set forth in claim 20, wherein the least significant bit of said first fixed value is set "1" and all bits of said first fixed value other than the least significant bit are set "0", all bits of said second fixed value and said third fixed value are set "0", and said m being set at a value derived by rounding a logarithm of 2 of the total filter tap number value into an integer.

23. A low pass filter as set forth in claim 19, wherein said total tap number value is a value corresponding to an impulse response period of said input data.

24. A low pass filter as set forth in claim 19, wherein said total tap number value is determined depending upon number of stages of delay element groups of the low pass filter having a plurality of delay element groups connected in cascade connection for leading out a tap.

* * * * *